US008004266B2

(12) United States Patent
Consoer

(10) Patent No.: US 8,004,266 B2
(45) Date of Patent: Aug. 23, 2011

(54) CHOPPER STABILIZED BANDGAP REFERENCE CIRCUIT AND METHODOLOGY FOR VOLTAGE REGULATORS

(75) Inventor: Kelly Joel Consoer, Tempe, AZ (US)

(73) Assignee: Linear Technology Corporation, Milpitas, CA (US)

( * ) Notice: Subject to any disclaimer, the term of this patent is extended or adjusted under 35 U.S.C. 154(b) by 326 days.

(21) Appl. No.: 12/470,932

(22) Filed: May 22, 2009

(65) Prior Publication Data

US 2010/0295529 A1 Nov. 25, 2010

(51) Int. Cl.
G05F 3/16 (2006.01)

(52) U.S. Cl. ........ 323/314; 323/313; 323/315; 323/907; 327/539

(58) Field of Classification Search ................. 323/313, 323/314, 315, 907; 327/539
See application file for complete search history.

(56) References Cited

U.S. PATENT DOCUMENTS

| | | | |
|---|---|---|---|
| 4,392,112 A | 7/1983 | Schade, Jr. | |
| 5,138,543 A | 8/1992 | Harm et al. | |
| 5,325,045 A | 6/1994 | Sundby | |
| 5,410,270 A | 4/1995 | Rybicki et al. | |
| 5,477,481 A | 12/1995 | Kerth | |
| 5,933,045 A | 8/1999 | Audy et al. | |
| 6,016,051 A | 1/2000 | Can | |
| 6,052,020 A * | 4/2000 | Doyle | 327/539 |
| 6,064,257 A | 5/2000 | Sauer | |
| 6,075,407 A | 6/2000 | Doyle | |
| 6,130,578 A | 10/2000 | Tang | |
| 6,462,612 B1 | 10/2002 | Roh et al. | |
| 6,664,847 B1 | 12/2003 | Ye | |
| 6,828,847 B1 * | 12/2004 | Marinca | 327/513 |
| 6,891,358 B2 * | 5/2005 | Marinca | 323/316 |
| 7,253,597 B2 * | 8/2007 | Brokaw | 323/314 |
| 7,304,466 B1 * | 12/2007 | Kimura | 323/313 |
| 7,400,128 B2 | 7/2008 | Richardson | |
| 7,411,380 B2 * | 8/2008 | Chang et al. | 323/314 |
| 7,482,798 B2 | 1/2009 | Han | |
| 7,750,726 B2 * | 7/2010 | Fujisawa et al. | 327/538 |
| 2007/0052473 A1 * | 3/2007 | McLeod | 327/539 |
| 2009/0002048 A1 * | 1/2009 | Fujisawa et al. | 327/306 |
| 2009/0315532 A1 * | 12/2009 | Negoi et al. | 323/312 |

OTHER PUBLICATIONS

European Search Report issued in European Patent Application No. 10005284.4-1239, mailed Apr. 12, 2011.
A. Pierazzi., et al., "Band-Gap References for near 1-V operation in standard CMOS technology", IEEE Custom Integrated Circuit Conference, 2001, pp. 463-466.
C. C. Enz., etal., "A CMOS Chopper Amplifier", IEEE Journal of Solid-State Circuits, vol. SC-22 No. 3, pp. 335-342, Jun. 1987, IEEE.

(Continued)

Primary Examiner — Bao Q Vu
(74) Attorney, Agent, or Firm — McDermott Will & Emery LLP

(57) ABSTRACT

A chopper stabilized bandgap voltage reference circuit comprises current mirror circuitry mirroring first and second currents into first and second networks to generate a forward diode voltage signal and a PTAT (proportional to absolute temperature) component signal, and a third current having a derived temperature coefficient into a third network to generate a reference voltage signal for a regulator. An amplifier amplifies a differential signal of the forward diode voltage signal and the PTAT component signal to output a fourth current to control the first and second currents. According to a chopper clock, a modulator modulates the differential signal to be supplied to the amplifier and a demodulator demodulates the fourth current. A gain loop compensation circuit is coupled to the demodulator to compensate the amplifier, and filter the fourth current for noise components, and a bypass circuit is also provided to the third network for filtering the third current.

16 Claims, 6 Drawing Sheets

OTHER PUBLICATIONS

C. C. Enz., et al., "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, pp. 1584-1614, IEEE.

M.A.T. Sanduleanu., et al., "A Low Noise, Low Residual Offset, Chopped Amplifier for Mixed Level Applications", 1998, pp. 333-336, IEEE.

* cited by examiner

CHOPPER STABILIZED BANDGAP REFERENCE CIRCUIT AND METHODOLOGY FOR VOLTAGE REGULATORS

TECHNICAL FIELD

This disclosure relates to a bandgap reference, and more particularly, to a bandgap reference circuit and methodology to be used with a linear or switching regulator.

DESCRIPTION OF RELATED ART

Current mode bandgap reference circuits are widely used in integrated circuits to provide a reference current that is compensated for variation in temperature (see U.S. Pat. No. 7,482,798 titled "Regulated Internal Power Supply and Method," incorporated herein by reference). In a current mode bandgap reference circuit, a current is generated that is a weighted sum of a component that is proportional to a bipolar transistor base-to-emitter voltage ($V_{BE}$) and a component that is proportional to a difference of $V_{BE}$s, referred to as $\Delta V_{BE}$. $\Delta V_{BE}$ is defined as a difference in $V_{BE}$s of two transistors that have emitter current densities of a known ratio (diodes can also be used). In other words, the negative temperature coefficient of a $V_{BE}$ is combined with the positive temperature coefficient (PTAT: proportional to absolute temperature) of a $\Delta V_{BE}$ multiplied by a gain of K-factor, so as to obtain a reference current that has an average temperature coefficient of zero, or some other desired value, over a target temperature range. This reference current generated by temperature compensated voltages across gain resistors is proportional to absolute resistance (PTAR). A reference voltage having a selected value may be produced from such a PTAR reference current by mirroring it into, for example, a resistor, with the mirror gain and resistor value chosen to produce the desired voltage. Such an approach has become common, since many modern scaled CMOS processes cannot accommodate the intrinsic voltage-mode bandgap voltage of approximately 1.2 volts.

However, an output (reference voltage) of such a current mode bandgap reference circuit may include offset voltage errors caused by a gain amplifier included in the circuit because the operational amplifier may be asymmetric with respect to zero inputs differential. The output may further include low frequency circuit noise known as 1/f noise including flicker noise, popcorn noise, shot noise, and low frequency thermal noise that originate in the input stage of the operational amplifier. Accordingly, the current mode bandgap reference circuit may not always provide a noise-free reference voltage to a linear voltage regulator or a switching regulator to regulate a voltage to be supplied to a load.

The subject matter described herein addresses, but is not limited to, the above shortcomings.

SUMMARY OF DISCLOSURE

Embodiments detailed herein describe a current mode chopper stabilized bandgap voltage reference circuit for a regulator such as a linear regulator or a switching regulator. In one aspect, the bandgap voltage reference circuit comprises current mirror ($\Delta V_{BE}$ and $V_{BE}$) circuitry configured for mirroring first and second currents into first and second networks to generate a forward diode voltage signal and a PTAT (proportional to absolute temperature) component signal, respectively, and a third current having a derived temperature coefficient based on the first and second currents into a third network to generate a reference voltage signal to be supplied to the regulator. An amplifier is included for amplifying a differential signal of the forward diode voltage signal and the PTAT component signal to output a fourth current to control the first and second currents in the first and second diode networks. The bandgap voltage reference circuit also includes a modulator coupled between the current mirror ($\Delta V_{BE}$ and $V_{BE}$) circuitry and the amplifier, synchronized to a chopper clock, and configured for modulating the differential signal to be supplied to the amplifier. A demodulator is coupled to the amplifier. The demodulator is synchronized to the chopper clock and configured for demodulating the fourth current. The chopper clock may be variable. The chopper clock may also be dithered or applied in a form of spectral spreading to reduce aliasing with other repetitive noise sources. Further, the bandgap voltage reference circuit includes a gain loop compensation circuit coupled to the demodulator to compensate the fourth current for noise components, and a bypass circuit provided to the third network for filtering the third current.

The first network may include a first current mirror, a first pn junction device coupled to the first current mirror, a first shunt resistor coupled to the first current mirror in parallel with the first pn junction device, and a first node coupling the first pn junction device and the first shunt resistor to the first current mirror. The second network may include a second current mirror, a second resistor coupled to the second current mirror, a second pn junction device coupled to the second resistor in series, a second shunt resistor coupled to the second current mirror in parallel with the second resistor and the second pn junction device, and a second node coupling the second resistor and the second shunt resistor to the second current mirror, the differential signal being obtained based on voltages at the first and second nodes. The third network may include a third current mirror, a second resistor, and an output node between the third current mirror and the second resistor. The bypass circuit may also be coupled to the output node and parallel with the second resistor.

The gain loop compensating circuit may include a capacitor to create a pole that is lower than fc/2, where fc is a chopper clock frequency.

The current mirror circuitry may include a curvature correction circuit for compensating for a temperature deviation. The curvature correction circuit can include a first positive temperature coefficient resistor serially coupled to the first shunt resistor in the first network, and a second positive temperature coefficient resistor serially coupled to the second shunt resistor in the second network. The curvature correction circuit may further include a negative temperature coefficient resistor coupled between the second resistor and the second pn junction device in the second network.

Alternatively, the third network may comprise N (N>1) third networks each including a third current mirror, a second resistor, and an output node between the third current mirror and the second resistor to provide the reference voltage signal to the regulator. The second resistor may have a value different from that of another third network, and the output node may have the bypass circuit which is parallel with the second resistor. The reference voltage signal can selectively be drawn from one of output nodes in the N third networks.

The bandgap voltage reference circuit may further comprise a low pass filter coupled to the output node for filtering the reference voltage signal.

In another aspect, a method for generating a bandgap reference voltage signal for a regulator is provided. First and second currents are mirrored into first and second networks in current mirror circuitry to generate a forward diode voltage signal and a PTAT (proportional to absolute temperature) component signal, respectively, and a third current having a derived temperature coefficient based on the first and second currents is mirrored into a third network of the current mirror circuitry to generate a reference voltage signal to be supplied to the regulator. A differential signal of the forward diode voltage and the PTAT component signal from the current mirror circuitry is modulated in accordance with a chopper clock. The modulated signal is amplified by an amplifier to output a fourth current, which is then demodulated in accordance with the chopper clock. The fourth current is compensated for noise components. The first and second currents in the first and second networks are controlled based on the compensated fourth current. The third current in the third network of the current mirror circuitry is also filtered. The method may further perform a curvature correction for compensating for a temperature deviation.

Additional aspects and advantages of the present disclosure will become readily apparent to those skilled in the art from the following detailed description, wherein only exemplary embodiments of the present disclosure is shown and described, simply by way of illustration of the best mode contemplated for carrying out the present disclosure. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

BRIEF DESCRIPTION OF THE DRAWINGS

Examples of the subject matter claimed herein are illustrated in the figures of the accompanying drawings and in which reference numerals refer to similar elements and in which:

DESCRIPTION OF THE EMBODIMENT

The embodiment implements a low voltage chopper stabilized bandgap derivative voltage reference circuit in the application of a linear voltage regulator to reduce offset voltage errors and low frequency circuit noise such as flicker noise, popcorn noise, shot noise, and low frequency thermal noise that originate in the input stage of a gain amplifier, in order to achieve a scalable low voltage reference.

Figure 1:
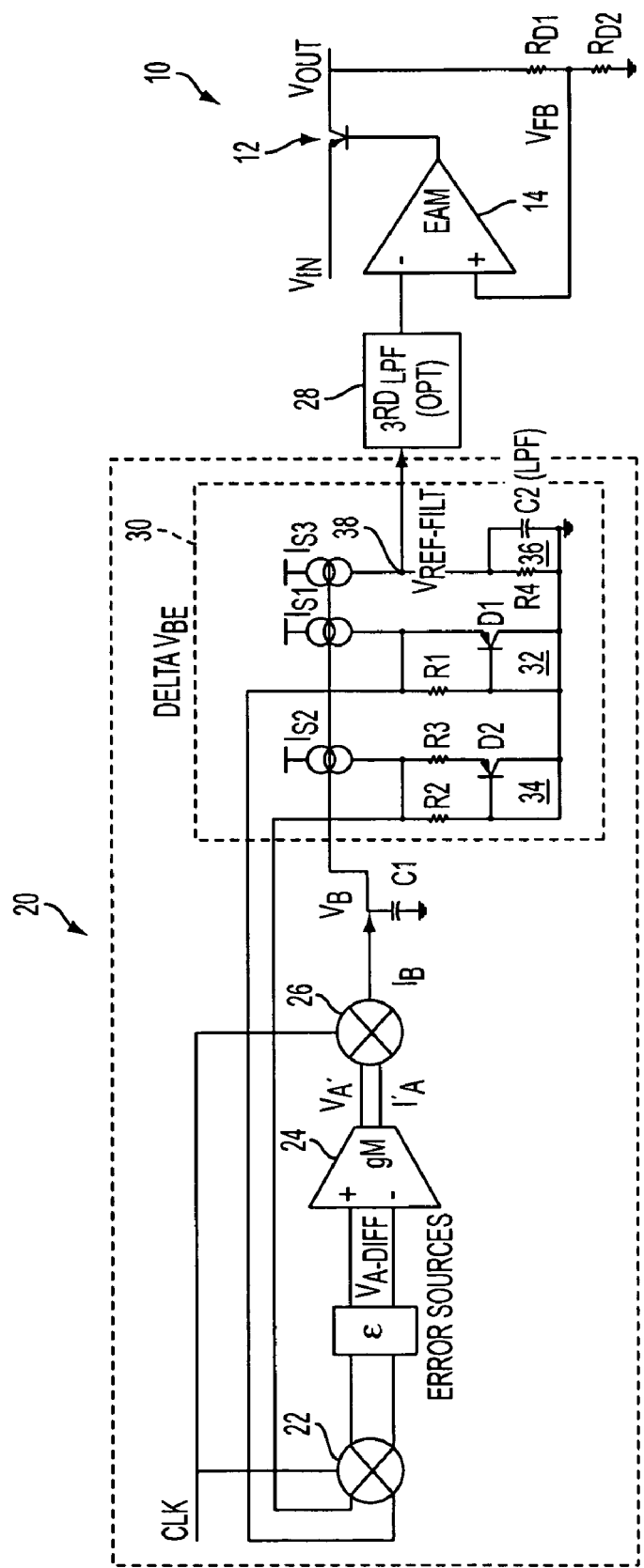
FIG. 1 is a circuit diagram showing a current-mode bandgap reference circuit for a linear voltage regulator according to one embodiment of the disclosure.

FIG. 1 is a circuit diagram of a chopper-stabilized current-mode bandgap reference circuit in a CMOS technology for a linear voltage regulator according to one embodiment of the disclosure. Linear voltage regulator 10 comprises pass device 12 and error amplifier 14. Bandgap reference circuit 20 includes delta $V_{BE}$ mirror network 30, modulator 22, amplifier 24, demodulator 26, compensation capacitor C1 (first low pass filter), reference output low pass filter capacitor C2, and tertiary low pass filter 28 (third low pass filter) (optional). In this example, amplifier 24 may be a transconductance (gm) amplifier (see FIG. 1).

Delta $V_{BE}$ mirror network 30 is a current mirror circuit including first to third networks 32, 34, and 36 respectively coupled between a power supply node and a ground node. Delta $V_{BE}$ mirror network 30 is controlled by an output of amplifier 24 to supply a forward diode voltage Vf and a PTAT (delta-$V_{BE}$+Vf) component signal as differential inputs to modulator 22, as set forth below, and provide reference voltage $V_{REF}$ to error amplifier 14 for voltage regulation.

First network 32 of delta $V_{BE}$ mirror network 30 may include current source $I_{S1}$, PNP transistor D1 (pn junction device), and shunt resistor R1 coupled to current source $I_{S1}$ in parallel with PNP transistor D1. Forward diode voltage Vf1 (i.e., bipolar transistor base-to-emitter voltage ($V_{BE}$)) can be obtained across shunt resistor R1, and is provided as one of differential inputs to modulator 22. Second network 34 may include current source $I_{S2}$, resistor R3, PNP transistor D2 (pn junction device), and shunt resistor R2 coupled to current source $I_{S2}$ in parallel with resistor R3 and PNP transistor D2. The Delta-$V_{BE}$ PTAT voltage appears across resistor R3. The PTAT component+Vf2 is provided as another of the differential inputs to modulator 22. Third network 36 may include current source $I_{S3}$, resistor R4, output node 38 coupled between current source $I_{S3}$ and resistor R4 to provide reference voltage $V_{REF}$ to the inverting input of error amplifier 14, and external bypass capacitor C2 (second low pass filter) coupled to output node 38 in parallel with resistor R4 for filtering a current flowing through third network 36.

PNP transistors D2 may have an emitter current density greater than that of PNP transistors D1. PNP transistors could be replaced with, for example, diodes. The present embodiment can be implemented by a CMOS technology using vertical substrate PNP transistors. Amplifier 24 may also be a PMOS input CMOS amplifier with integrated compensation capacitor C1.

Figure 2:
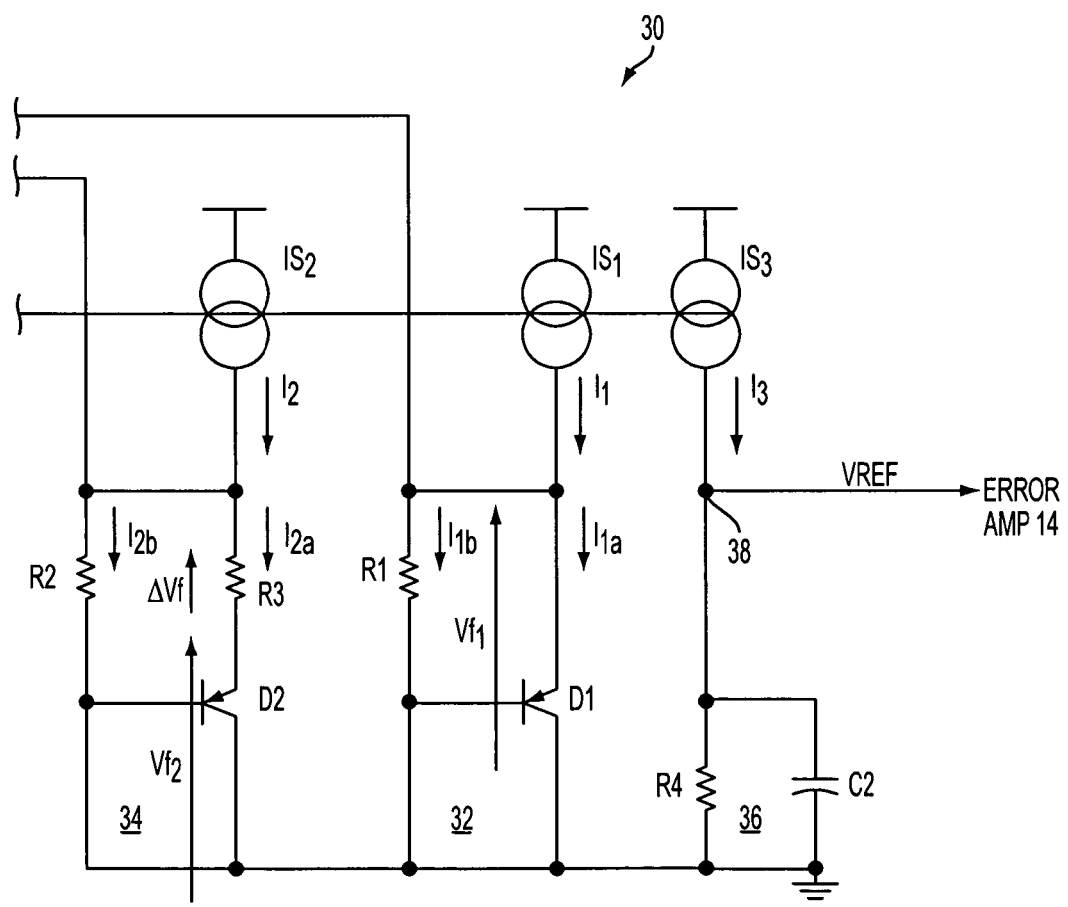
FIG. 2 is a diagram for explaining a delta $V_{BE}$ mirror network shown in FIG. 1.

FIG. 2 is a diagram for explaining delta $V_{BE}$ mirror network 30 in FIG. 1. In delta $V_{BE}$ mirror network 30, two currents, proportional respectively to Vf (i.e., bipolar transistor base-to-emitter voltage ($V_{BE}$)) and Vt=(KT/q), are generated (K is Bolzmann's constant, T is the absolute temperature, and q is the electron charge). When (1) the same aspect ratio is used for transistors for current sources $I_{S1}$ to $I_{S3}$, and (2) resistors R1 and R2 have the same resistance value, then currents I1, I2, and I3 have the same value, current I1b is equal to current I2b, and therefore, current I1a is also equal to current I2a, as long as amplifier 24 (see FIG. 1) is able to maintain its inputs to be the same voltage.

The value of current I2b is obtained as follows:

$$I2b = \frac{Vf1}{R2}$$

On the other hand, current I2a can be expressed as a function of Vt (PTAT term):

$$I2a = \frac{\Delta Vf}{R3} = \frac{Vt \cdot \ln(N)}{R3}$$

where ΔVf is the difference between the forward voltage of diodes, i.e., base-to-emitter voltages ($V_{BE}$) of PNP transistors D1 and D2, and N is the area ratio between the two diodes (the base and emitter junction area ratio between PNP transistors D1 and D2). From the above derivations, current I3 can be expressed as the sum of a term linearly dependent on forward voltage Vf and the PTAT component (current I3 having a derived temperature coefficient based on current I1 and current I2), and thus reference voltage $V_{REF}$ is expressed as follows:

$$V_{REF} = R4 \cdot \left( \frac{Vf1}{R2} + \frac{\Delta Vf}{R3} \right)$$

Therefore, by choosing a value for resistor R4, desired low voltage reference $V_{REF}$ can be obtained.

In operation, delta $V_{BE}$ mirror network 30 mirrors currents I1-I3 to bias PNP transistors D1 and D2 in first and second delta-$V_{BE}$ bandgap networks 32 and 34, respectively. First and second networks 32 and 34 are shunted by shunt resistors R1 and R2 to transform a loop function into a reference current generator that can operate below an intrinsic bandgap voltage. The mirrored current in third network 36 is converted into voltage reference $V_{REF}$ at output node 38 by resistor R4 having a desired resistance value. The nature of current I3 is PTAR (proportional to absolute resistance). Delta $V_{BE}$ mirror network 30 thus provides voltage reference $V_{REF}$ to error amplifier 14, and also feeds back the forward diode voltage signal and the PTAT component signal to modulator 22.

Modulator 22 receives forward voltage Vf and the PTAT component signal as differential inputs from delta $V_{BE}$ mirror network 30 and modulates them by a chopper clock from a clock generator (not shown). The chopper clock may be a clock having a predetermined clock frequency. The clock may also be dithered or applied in the form of spectral spreading by frequency modulation or by pulse width modulation in order to reduce aliasing with other repetitive noise sources. A clock frequency can be variable, implementation of which is well known, for example, in U.S. Pat. No. 6,064,257, titled "Chopper-Stabilized Operational Amplifier" and U.S. Pat. No. 6,130,578 titled "Chopper-Stabilized Amplifier with Digital Frequency Modulated Clocking and Method," incorporated herein by reference. By modulator 22, the differential inputs are modulated up to the clock frequency.

Figure 3:
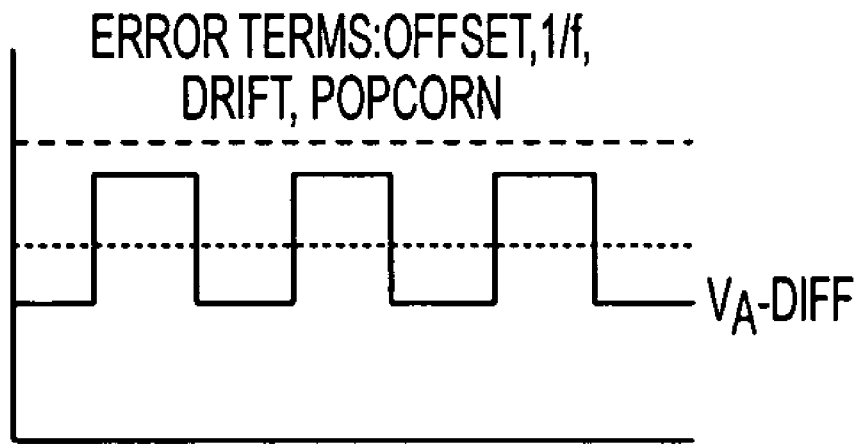
FIG. 3 shows input referred noises from an amplifier according to one embodiment of the disclosure.
Figure 4:
FIG. 4 shows an output current from the amplifier according to one embodiment of the disclosure.

Amplifier 24 amplifies the modulated differential inputs, and outputs an amplified differential signals. There are error sources in the input stage of amplifier 24. Noises imposed to the input signals of amplifier 24 by the error sources include offset voltage noises, and low frequency circuit noises known as 1/f noises including flicker noise, popcorn noise, shot noise, and low frequency thermal noise, as mentioned above. Amplifier 24 amplifies the modulated differential inputs together with such noises. FIG. 3 shows an output current from amplifier 24 and input referred noises from amplifier 24, and FIG. 4 shows an output current from amplifier 24. Any error signals generated by amplifier 24 are summed with the modulated differential inputs in an alternating phase.

Demodulator 26 receives the amplified signal and demodulates the signal by the chopper clock from clock generator 50 to output a demodulated signal. Demodulator 26 reconstructs the gained differential signal in which the demodulated error signals manifest as ripple at the chopper clock frequency.

Operation of demodulator 26 is synchronized with that of modulator 22 through the chopper clock. In this embodiment, the differential inputs from delta $V_{BE}$ network 30 is converted to a single-ended signal by demodulator 26. As persons skilled in the art appreciate, such conversion can be performed by either amplifier 24 or demodulator 26.

Compensating capacitor C1 is provided as a loop gain compensation circuit to compensate amplifier 24 and provide first order filtering of the demodulated signal so as to attenuate the error signal ripple. The noise components imposed on the differential inputs at the input stage of amplifier 24 can be removed. This capacitor may be provided at a single-ended output node to create a pole that is lower than fc/2, where fc is a frequency of the chopper clock to modulator 22 and demodulator 26. Compensating capacitor C1 is independent of reference output low pass filter capacitor C2.

Figure 5:
FIG. 5 shows a demodulated current and a voltage compensated by a compensation capacitor according to one embodiment of the disclosure.

The reason why the noise components from the error sources can be removed is explained below. The differential inputs to amplifier 24 are modulated by modulator 22 using a high frequency chopper clock before the offset voltage and/or 1/f noise components associated with the amplifier has acted upon the differential signals. The modulated input signals are then amplified and demodulated. The demodulation process returns the originally modulated input signal component of the amplified signal to a baseband representation. However, because the offset voltage and/or 1/f noise components of the amplified signal are not originally modulated, the demodulation process modulates these noise components to a higher frequency. These high frequency noise components are then filtered out by compensation capacitor C1 to achieve a desired output signal to control delta $V_{BE}$ mirror network. Accordingly, the chopper stabilization utilized can reduce negative effects of the offset voltage variation and/or 1/f noise within amplification in the bandgap reference circuit. FIG. 5 shows a demodulated current and a voltage compensated by capacitor C1.

The output from amplifier 24, which is demodulated and compensated, is mirrored to the first and second currents in currents I1 and I2, thus closing a bandgap reference loop. Delta $V_{BE}$ mirror network 30 mirrors currents I1-I3 to bias PNP transistors D1 and D2 in first and second delta-$V_{BE}$ bandgap networks 32 and 34, and the mirrored current in third network 36 is converted into voltage reference $V_{REF}$ at output node 38 by resistor R4 having a desired resistance value. Output node 38 has external bypass capacitor C2 to attenuate a clock residue from the mirror current so as to further remove the noise components.

In addition, it may be possible to add low pass filter 28 between output node 38 and error amplifier 14 to further remove the noise components. Optional low pass filter 28 can be implemented by a passive architecture or a switched-capacitor architecture. The switched-capacitor architecture is well known, for example, in U.S. Pat. No. 5,477,481, titled "Switched-Capacitor Integrator with Chopper Stabilization Performed at the Sampling Rate," incorporated herein by reference.

Returning to FIG. 1, pass device 12 provides a path from the supply voltage to the load. In this embodiment, a PMOS transistor is used as pass device 12, but for example, an NMOS transistor, a PNP transistor, and an NPN transistor can also be utilized, given the appropriate inverting phase at the error amplifier inputs.

Output voltage $V_{OUT}$ is divided to be feedback voltage $V_{FB}$ by voltage divider $R_{D1}$ and $R_{D2}$. Feedback voltage $V_{FB}$ is provided to the non-inverting input of error amplifier 14 and reference voltage $V_{REF}$ from chopper stabilized bandgap reference circuit 20 is provided to the inverting input of the error amplifier. Error amplifier 14 controls pass device 12 so as to linearly control the magnitude of power to be delivered to the load. When feedback voltage $V_{FB}$ is greater than reference voltage $V_{REF}$, the power delivery to the load will be decreased, while when feedback voltage $V_{FB}$ is smaller than reference voltage $V_{REF}$, the power delivery to the load will be increased.

According to the above-described embodiment, bandgap reference circuit 20 includes at least two filters such as compensation capacitor C1 and bypass capacitor C2 provided, for example, at the output stage of demodulator 26 and at output node 38 coupled to error amplifier 14. Accordingly, the noise components are effectively removed and an error-removed reference voltage (as much as possible) may be provided to the error amplifier. As a result, a stable operation of the reference can be achieved.

Figure 6:
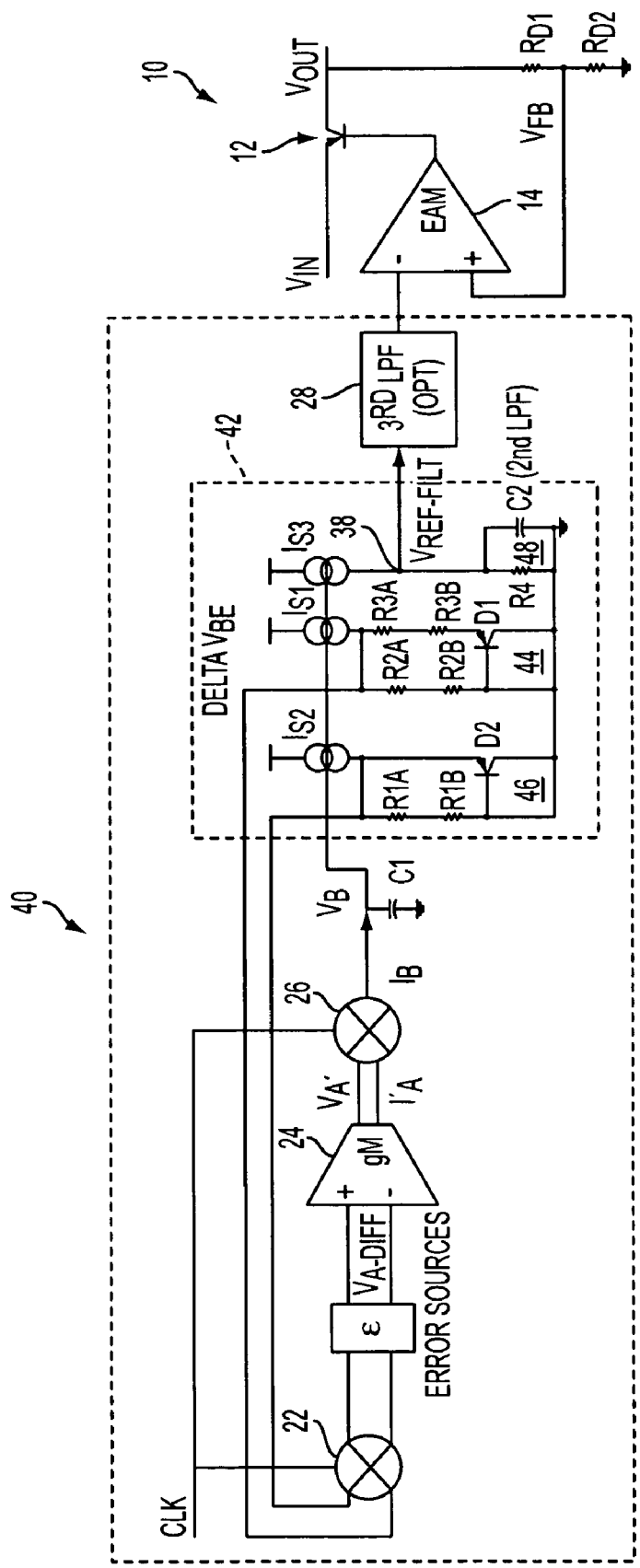
FIG. 6 is a circuit diagram showing a current-mode bandgap reference circuit for a linear voltage regulator according to another embodiment of the disclosure.

FIG. 6 is a circuit diagram showing a current-mode bandgap reference circuit for a linear voltage regulator according to another embodiment of the disclosure. Bandgap reference circuit 40 shown in FIG. 6 has delta $V_{BE}$ mirror network 42 which is slightly different from delta $V_{BE}$ mirror network 30 shown in FIG. 1. Other components of bandgap reference circuit 40 are the same as those shown in FIG. 1, and their explanations are omitted for brevity.

Delta $V_{BE}$ mirror network 42 includes a second order temperature curvature correction circuit which can supplant a portion of K-factor gain (shunt) resistors R1A and R2A with contrasting positive second order temperature curvature resistors R1B and R2B. Temperature curvature resistors R1B and R2B are provided in a gain loop together with shunt resistors R1A and R2A. Delta $V_{BE}$ mirror network 42 may also supplant a portion of $\Delta V_{BE}$ resistor R3A with complementary negative second order temperature curvature resistor R3B. Most of different types of resistors available in integrated circuits have positive TC (temperature coefficient). Example of such resistors are diffused, well, polysilicon, and epitaxial resistors. Thin film SiCr or NiCr resistors typically have negative TC, for example.

The temperature curvature correction circuit shown in FIG. 6 is discussed in, for example, U.S. Pat. No. 5,933,045, titled "Ratio Correction Circuit and Method for Comparison of Proportional to Absolute Temperature Signals to Bandgap-Based Signals" and U.S. Pat. No. 5,325,045 titled "Low Voltage CMOS Bandgap with New Trimming and Curvature Correction Methods," incorporated herein by reference.

Figure 7:
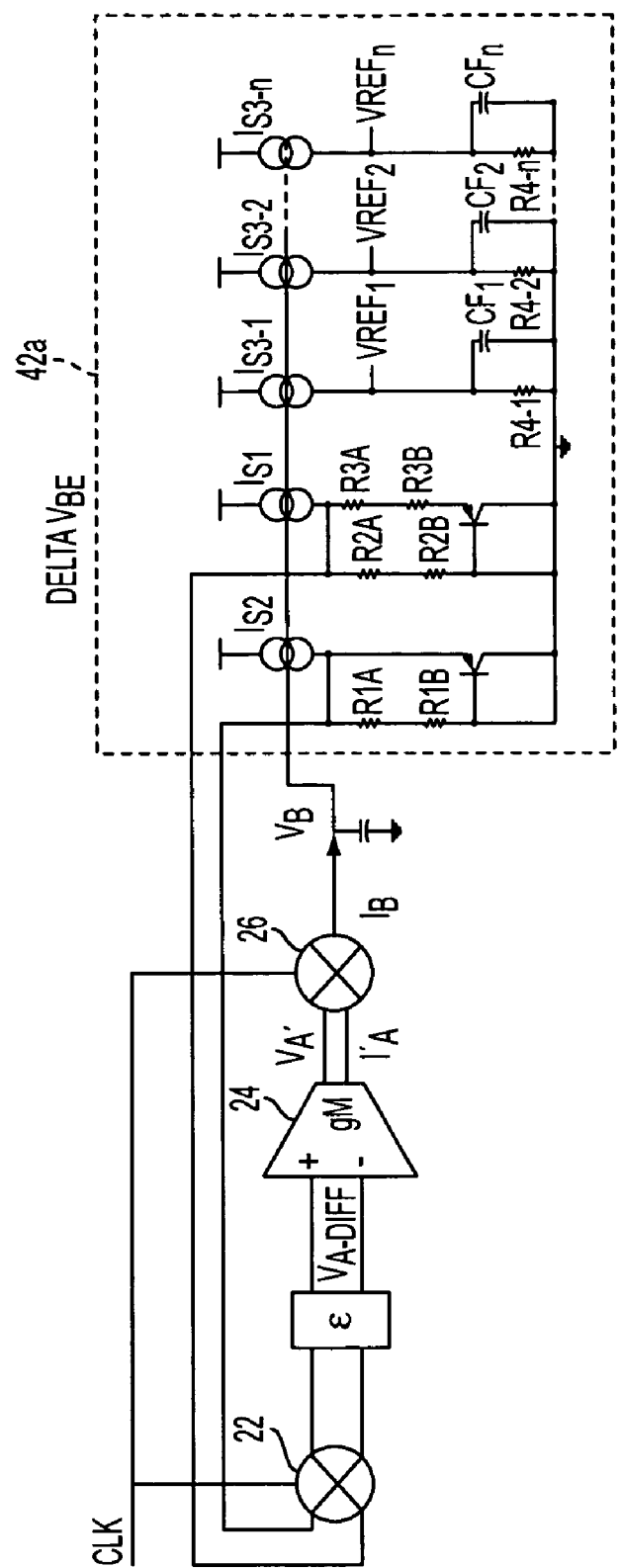
FIG. 7 is a diagram showing a modified configuration of a delta $V_{BE}$ mirror network according to one embodiment of the disclosure.

FIG. 7 is a diagram showing a modified configuration of delta $V_{BE}$ mirror network 42 of FIG. 6. Modified $V_{BE}$ mirror network 42a includes N independent current sources ($I_{S3-1}$ to $I_{S3-n}$) to generate N unique discrete reference voltages (such as $V_{REF1}$ to $V_{REFn}$) between the ground voltage and the maximum operating voltage. By choosing values for respective resistors R4-1 to R4-3, desired voltage references $V_{REF1}$ to $V_{REFn}$ can be obtained. Currents through resistors R4-1 to R4-n are filtered by capacitors CF2-1 to CF2-n, respectively, to further remove the noise components.

It is noted, for example, that one of reference voltages $V_{REF1}$ to $V_{REFn}$ can selectively be provided to error amplifier 14 by, for example, a controller (not shown). The controller may select one of reference voltages $V_{REF1}$ to $V_{REFn}$ in accordance with user's instruction. Alternatively, one of reference voltages $V_{REF1}$ to $V_{REFn}$ can be selected when a chip implementing this embodiment is manufactured.

Persons skilled in the art will appreciate that the low voltage chopper stabilized bandgap derivative voltage reference circuits disclosed above can be applied to a switching regulator such as a buck regulator, a boost regulator, or a buck-boost regulator, instead of the linear regulator.

Having described embodiments, it is noted that modifications and variations can be made by person skilled in the art in light of the above teachings. It is therefore to be understood that changes may be made in the particular embodiments disclosed that are within the scope and sprit of the disclosure as defined by the appended claims and equivalents.

What is claimed is:

1. A current mode chopper stabilized bandgap voltage reference circuit for a regulator comprising:

current mirror circuitry configured for mirroring first and second currents into first and second networks to generate a forward diode voltage signal and a PTAT (proportional to absolute temperature) component signal, respectively, and a third current having a derived temperature coefficient based on the first and second currents into a third network to generate a reference voltage signal to be supplied to the regulator;

an amplifier configured for amplifying a differential signal of the forward diode voltage signal and the PTAT component signal to output a fourth current to control the first and second currents in the first and second diode networks;

a modulator coupled between the current mirror circuitry and the amplifier, synchronized to a chopper clock, and configured for modulating the differential signal to be supplied to the amplifier;

a demodulator coupled to the amplifier, synchronized to the chopper clock, and configured for demodulating the fourth current;

a gain loop compensation circuit coupled to the demodulator to compensate the amplifier, and filter the fourth current for noise components; and a bypass circuit provided to the third network for filtering the third current.

2. The chopper stabilized bandgap voltage reference circuit according to claim 1, wherein the first network includes a first current mirror, a first pn junction device coupled to the first current mirror, a first shunt resistor coupled to the first current mirror in parallel with the first pn junction device, and a first node coupling the first pn junction device and the first shunt resistor to the first current mirror, the second network includes a second current mirror, a second resistor coupled to the second current mirror, a second pn junction device coupled to the second resistor in series, a second shunt resistor coupled to the second current mirror in parallel with the second resistor and the second pn junction device, and a second node coupling the second resistor and the second shunt resistor to the second current mirror, the differential signal being obtained based on voltages at the first and second nodes, the third network includes a third current mirror, a second resistor, and an output node between the third current mirror and the second resistor, and the bypass circuit is coupled to the output node and is parallel with the second resistor.

3. The chopper stabilized bandgap voltage reference circuit according to claim 1, further comprising a low pass filter coupled to the output node for filtering the reference voltage signal.

4. The chopper stabilized bandgap voltage reference circuit according to claim 1, wherein the compensating circuit includes a capacitor to create a pole that is lower than fc/2, where fc is a chopper clock frequency.

5. The chopper stabilized bandgap voltage reference circuit according to claim 1, wherein
the first network includes a first current mirror, a first pn junction device coupled to the first current mirror, a first shunt resistor coupled to the first current mirror in parallel with the first pn junction device, and a first node coupling the first pn junction device and the first shunt resistor to the first current mirror,
the second network includes a second current mirror, a second resistor coupled to the second current mirror, a second pn junction device coupled to the second resistor in series, a second shunt resistor coupled to the second current mirror in parallel with the second resistor and the second pn junction device, and a second node coupling the second resistor and the second shunt resistor to the second current mirror, the differential signal being obtained based on voltages at the first and second nodes, and
the third network comprises N (N>1) third networks each including a third current mirror, a second resistor, and an output node between the third current mirror and the second resistor to provide the reference voltage signal to the regulator, the second resistor having a value different from that of another third network, the output node having the bypass circuit which is parallel with the second resistor.

6. The chopper stabilized bandgap voltage reference circuit according to claim 5, wherein the reference voltage signal is selectively drawn from one of output nodes in the N third networks.

7. The chopper stabilized bandgap voltage reference circuit according to claim 1, wherein the current mirror circuitry further comprises a curvature correction circuit for compensating for a temperature deviation.

8. The chopper stabilized bandgap voltage reference circuit according to claim 2, wherein the current mirror circuitry includes a gain loop having a curvature correction circuit for compensating for a temperature deviation, the curvature correction circuit comprising:
a first positive temperature coefficient resistor serially coupled to the first shunt resistor in the first network, and
a second positive temperature coefficient resistor serially coupled to the second shunt resistor in the second network.

9. The chopper stabilized bandgap voltage reference circuit according to claim 8, wherein the curvature correction circuit further comprises a negative temperature coefficient resistor coupled between the second resistor and the second pn junction device in the second network.

10. The chopper stabilized bandgap voltage reference circuit according to claim 5, wherein the current mirror circuitry further comprises a curvature correction circuit for compensating for a temperature deviation, the curvature correction circuit comprising:
a first positive temperature coefficient resistor serially coupled to the first shunt resistor in the first network, and
a second positive temperature coefficient resistor serially coupled to the second shunt resistor in the second network.

11. The chopper stabilized bandgap voltage reference circuit according to claim 10, wherein the curvature correction circuit further comprises a negative temperature coefficient resistor coupled between the second resistor and the second pn junction device in the second network.

12. The chopper stabilized bandgap voltage reference circuit according to claim 1, wherein the chopper clock is variable.

13. The chopper stabilized bandgap voltage reference circuit according to claim 1, the chopper clock is dithered or applied in a form of spectral spreading.

14. The chopper stabilized bandgap voltage reference circuit according to claim 1, wherein the regulator is one of a linear regulator and a switching regulator.

15. A method for generating a bandgap reference voltage signal for a regulator, comprising the steps of:
mirroring first and second currents into first and second networks in current mirror circuitry to generate a forward diode voltage signal and a PTAT (proportional to absolute temperature) component signal, respectively, and a third current having a derived temperature coefficient based on the first and second currents into a third network of the current mirror circuitry to generate a reference voltage signal to be supplied to the regulator;
modulating, synchronized to a chopper clock, a differential signal of the forward diode voltage and the PTAT component signal from the current mirror circuitry;
amplifying, by an amplifier, the modulated signal to output a fourth current;
demodulating, synchronized to the chopper clock, the fourth current;
compensating the fourth current for noise components;
controlling the first and second currents in the first and second networks based on the compensated fourth current; and
filtering the third current in the third network of the current mirror circuitry.

16. The method according to claim 15, further including the step of performing, by the current mirror circuitry, a curvature correction for compensating for a temperature deviation.

* * * * *